(12) United States Patent
Choi et al.

(10) Patent No.: US 8,142,606 B2
(45) Date of Patent: Mar. 27, 2012

(54) APPARATUS FOR DEPOSITING A UNIFORM SILICON FILM AND METHODS FOR MANUFACTURING THE SAME

(75) Inventors: Soo Young Choi, Fremont, CA (US); Tae Kyung Won, San Jose, CA (US); Beom Soo Park, San Jose, CA (US); John M. White, Hayward, CA (US)

(73) Assignee: Applied Materials, Inc., Santa Clara, CA (US)

(*) Notice: Subject to any disclaimer, the term of this patent is extended or adjusted under 35 U.S.C. 154(b) by 951 days.

(21) Appl. No.: 11/759,542

(22) Filed: Jun. 7, 2007

(65) Prior Publication Data
US 2008/0305246 A1    Dec. 11, 2008

(51) Int. Cl.
*C23F 1/00* (2006.01)
*H01L 21/306* (2006.01)
*C23C 16/00* (2006.01)

(52) U.S. Cl. ............................ 156/345.34; 118/715
(58) Field of Classification Search ................ 118/715; 156/345.34
See application file for complete search history.

(56) References Cited

U.S. PATENT DOCUMENTS

| | | | |
|---|---|---|---|
| 5,567,243 A | 10/1996 | Foster et al. | |
| 5,628,869 A | 5/1997 | Mallon | |
| 5,686,349 A | 11/1997 | Nakata | |
| 6,979,589 B2 | 12/2005 | Kishimoto et al. | |
| 2003/0089314 A1 | 5/2003 | Matsuki et al. | |
| 2003/0209323 A1 | 11/2003 | Yokogaki | |
| 2003/0227258 A1* | 12/2003 | Strang et al. | 315/111.21 |
| 2005/0251990 A1 | 11/2005 | Choi et al. | |
| 2005/0255257 A1 | 11/2005 | Choi et al. | |
| 2006/0060138 A1 | 3/2006 | Keller et al. | |
| 2006/0228496 A1 | 10/2006 | Choi et al. | |
| 2006/0236934 A1 | 10/2006 | Choi et al. | |

FOREIGN PATENT DOCUMENTS

| | | |
|---|---|---|
| KR | 10-2005-0076070 | 7/2005 |
| KR | 2006-0045322 | 5/2006 |
| KR | 10-2006-0020215 | 9/2007 |

OTHER PUBLICATIONS

PCT Search Report; International Application No. PCT/US2008/066210; Dated Dec. 15, 2008.
Official Letter dated Dec. 21, 2010, from Chinese Patent Office for corresponding Chinese Patent Application No. 200880019012.

* cited by examiner

*Primary Examiner* — Keath Chen
(74) *Attorney, Agent, or Firm* — Patterson & Sheridan, L.L.P.

(57) ABSTRACT

Methods and apparatus having a gradient spacing created between a substrate support assembly and a gas distribution plate for depositing a silicon film for solar cell applications are provided. In one embodiment, an apparatus for depositing films for solar cell applications may include a processing chamber, a substrate support disposed in the processing chamber and configured to support a quadrilateral substrate thereon, and a gas distribution plate disposed in the processing chamber above the substrate support, wherein a bottom surface of the gas distribution plate has a perimeter that includes edges and corners, and wherein the corners of the gas distribution plate are closer to the substrate support than the edges of the gas distribution plate.

12 Claims, 9 Drawing Sheets

APPARATUS FOR DEPOSITING A UNIFORM SILICON FILM AND METHODS FOR MANUFACTURING THE SAME

CROSS-REFERENCE TO OTHER APPLICATIONS

This application is related to U.S. patent application Ser. No. 11/759,599, entitled "Methods and Apparatus for Depositing a Uniform Silicon Film With Flow Gradient Designs", filed Jun. 7, 2007, which is herein incorporated by reference.

BACKGROUND OF THE DISCLOSURE

1. Field of the Invention

Embodiments of the invention generally relate to a gas distribution plate assembly and method for manufacturing the same in a processing chamber.

2. Description of the Background Art

Photovoltaic (PV) devices or solar cells are devices which convert sunlight into direct current (DC) electrical power. PV or solar cells typically have one or more p-i-n junctions. Each junction comprises two different regions within a semiconductor material where one side is denoted as the p-type region and the other as the n-type region. When the p-i-n junction of the PV cell is exposed to sunlight (consisting of energy from photons), the sunlight is directly converted to electricity through a PV effect. PV solar cells generate a specific amount of electric power and cells are tiled into modules sized to deliver the desired amount of system power. PV modules are created by connecting a number of PV solar cells and are then joined into panels with specific frames and connectors.

PV solar cells typically include a photoelectric conversion unit formed on a large transparent substrate. The photoelectric conversion unit includes a p-type, an intrinsic type (i-type), and a n-type silicon layer sequentially disposed on the transparent substrate. The silicon films that may be utilized to form the photoelectric conversion unit may include polysilicon (poly-silicon), microcrystalline silicon ($\mu$c-Si), and amorphous silicon (a-Si) films. Plasma enhanced chemical vapor deposition (PECVD) is generally employed to deposit the silicon films on the transparent substrate. PECVD process is performed by introducing a precursor gas or gas mixture into a vacuum chamber that includes the transparent substrate. The precursor gas or gas mixture is supplied from a distribution plate toward the surface of the transparent substrate. A RF power is applied to the distribution plate and/or a substrate support assembly disposed in the chamber to form a plasma within the precursor gas or gas mixture, thereby depositing a silicon layer with desired film property on a surface of the transparent.

As the demand for larger solar cell substrates continues to grow, maintaining a uniform plasma and/or process gas flow during a PECVD process over the large substrate surface has become increasingly difficult. Film property variation between center and edge portions of films deposited on the large substrates caused by the process non-uniformity present a significant challenge for producing large and efficient solar cells. With ever increasing substrate size, edge to center property variation has become more problematic.

Therefore, there is a need for an improved apparatus for depositing a film having uniform distribution of film properties on large area substrates by a chemical vapor deposition process.

SUMMARY OF THE INVENTION

Methods and apparatus having a gradient spacing defined between a substrate support assembly and a gas distribution plate for depositing a silicon film for solar cell applications are provided. In one embodiment, an apparatus for depositing films for solar cell applications may include a processing chamber, a substrate support disposed in the processing chamber and configured to support a quadrilateral substrate thereon, and a gas distribution plate disposed in the processing chamber above the substrate support, wherein a bottom surface of the gas distribution plate has a perimeter that includes edges and corners, and wherein the corners of the gas distribution plate are closer to the substrate support than the edges of the gas distribution plate.

In another embodiment, an apparatus for depositing films for solar cell applications may include a processing chamber, a substrate support disposed in the processing chamber and configured to support a quadrilateral substrate thereon, and a gas distribution plate disposed in the processing chamber above the substrate support, wherein a bottom surface of the gas distribution plate has a perimeter that includes edges and corners, and wherein the edges of the gas distribution plate are concave.

In yet another embodiment, a method for depositing a silicon film for solar cell application in a chamber may include providing a substrate into a chamber having a gas distribution plate facing a substrate support, wherein a spacing between corners of the gas distribution plate and the substrate support is closer than a spacing between a midpoint of an edge of the gas distribution plate and the substrate support, flowing a processing gas through the gas distribution plate, and depositing a silicon film on the substrate.

In yet another embodiment, a method for depositing a silicon film for solar cell applications in a chamber may include providing a substrate into a chamber having a gas distribution plate facing a substrate support assembly, wherein the gas distribution plate and the substrate support assembly have a gradient spacing defined therebetween, supplying a gas mixture through a plurality of apertures formed through the gas distribution plate and into the chamber, wherein the gas mixture has a silane gas to hydrogen gas ratio of between 1:20 and 1:200, and depositing a silicon film on the substrate.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods and an apparatus for depositing a silicon film for large area applications, such as solar cells, are provided in the present invention. In one embodiment, the apparatus has an edge to corner gradient spacing defined between a gas distribution plate and a substrate support assembly. The spacing gradient created between the substrate surface and the gas distribution plate provides a flexible control of edge to corner distribution of process gases provided through the gas distribution plate to the substrate surface and/or plasma formed therefrom. The controlled spacing gradient enhances the ability to adjust thickness and/or profile of films deposited on the substrate. The spacing gradient created by different lateral spacing between the gas distribution plate and the substrate also provides a process control attribute which facilitates controlling film property variation over the width of the substrate.

Figure 1:
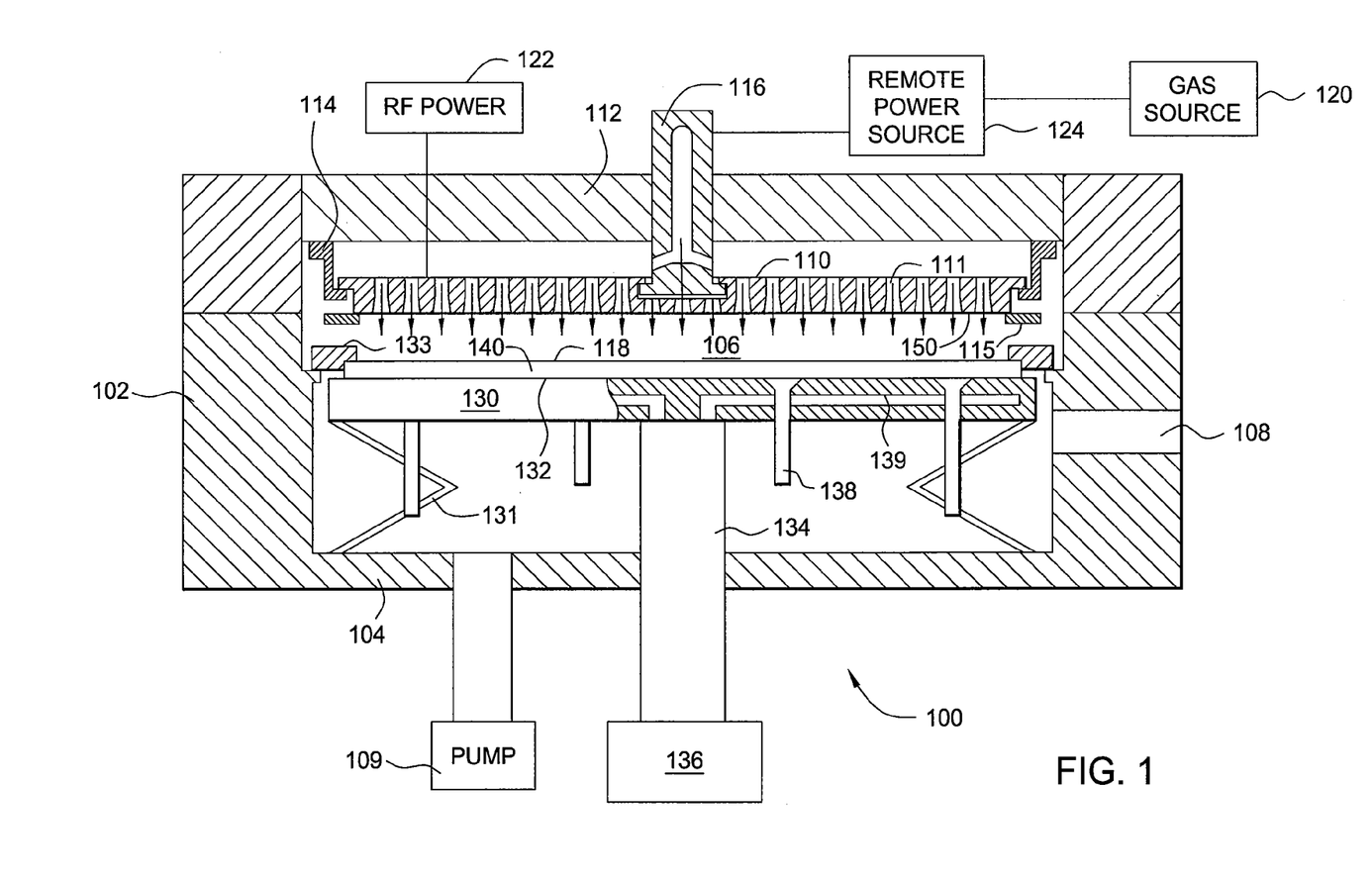
FIG. 1 depicts a schematic cross-sectional view of one embodiment of a process chamber in accordance with the invention.

FIG. 1 is a schematic cross-section view of one embodiment of a plasma enhanced chemical vapor deposition (PECVD) chamber 100 in which one or more films of a solar cell or other large area devices may be formed. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 100 generally includes walls 102 and a bottom 104 which bound a process volume 106. A gas distribution plate 110 and substrate support assembly 130 which define a process volume 106. The process volume 106 is accessed through a valve 108 formed through the wall 102 such that a substrate 140 may be transferred in and out of the chamber 100.

The substrate support assembly 130 includes a substrate receiving surface 132 for supporting the substrate 140 thereon and a stem 134. The stem 134 is coupled to a lift system 136 which raises and lowers the substrate support assembly 130 between substrate transfer and processing positions. A shadow frame 133 may be optionally placed over periphery of the substrate 140 when processing to prevent deposition on the edge of the substrate 140. Lift pins 138 are moveably disposed through the substrate support assembly 130 and are adapted to space the substrate 140 from the substrate receiving surface 132. The substrate support assembly 130 may also include heating and/or cooling elements 139 utilized to maintain the substrate support assembly 130 at a desired temperature. The substrate support assembly 130 may also include grounding straps 131 to provide RF grounding around the periphery of the substrate support assembly 130. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park, et al., which are both incorporated by reference in their entirety.

The gas distribution plate 110 is coupled to a backing plate 112 at its periphery by a suspension 114. The gas distribution plate 110 may also be coupled to the backing plate 112 by one or more center supports 116 to help prevent sag and/or control the straightness/curvature of the gas distribution plate 110. In one embodiment, the gas distribution plate 110 may be in different configurations with different dimensions. In an exemplary embodiment, the gas distribution plate 110 is a quadrilateral gas distribution plate. The gas distribution plate 110 has a downstream surface 150 having a plurality of apertures 111 formed therein facing an upper surface 118 of a substrate disposed on the substrate support assembly 130. In one embodiment, the apertures 111 may have different shape, numbers, densities, dimensions, and distributions across the gas distribution plate 110. The diameter of the apertures 111 may be selected between about 0.01 inch and about 1 inch. A gas source 120 is coupled to the backing plate 112 to provide gas through the backing plate 112, and then through the apertures 111 formed in the gas distribution plate 110 to the process volume 106.

A vacuum pump 109 is coupled to the chamber 100 to maintain the process volume 106 at a desired pressure. An RF power source 122 is coupled to the backing plate 112 and/or to the gas distribution plate 110 to provide a RF power to create an electric field between the gas distribution plate 110 and the substrate support assembly 130 so that a plasma may be generated from the gases between the gas distribution plate 110 and the substrate support assembly 130. Various RF frequencies may be used, such as a frequency between about 0.3 MHz and about 200 MHz. In one embodiment the RF power source is provided at a frequency of 13.56 MHz. Examples of gas distribution plates are disclosed in U.S. Pat. No. 6,477,980 issued on Nov. 12, 2002 to White, et al., U.S. Publication No. 20050251990 published on Nov. 17, 2005 to Choi, et al., and U.S. Publication No. 2006/0060138 published on Mar. 23, 2006 to Keller, et al, which are all incorporated by reference in their entirety.

In one embodiment, the edges of the downstream surface 150 of the gas distribution plate 110 may be curved so that a distance gradient is defined between the edge and corners of the plate 110 and substrate receiving surface 132 and, consequently, between the plate 110 and the surface 118 of the substrate 140. The shape of the curved surface 150 (e.g., convex, planar or concave) may be selected to meet specific process requirements. For example, it has been discovered that the uniformity of film properties does not necessarily correspond to thickness uniformity across the width of the substrate. Specifically, crystal fraction uniformity (i.e., the percent of the film which has been crystallized) across the width of the substrate has been found to be decoupled from film thickness uniformity. Therefore, the non-uniformity of crystal fraction is most prevalent in the corners of the substrate. Therefore, the edge to corner spacing gradient may be utilized to tune the film property uniformity across the edge of the substrate, thereby correcting property non-uniformity in the corner of the substrate. Additionally, the edge to center spacing may also be controlled so that the film property distribution uniformity may be controlled between the edge and center of the substrate. In one embodiment, a concave curved edge of the gas distribution plate 110 may be used to have the center portion of the edge of the gas distribution plate 110 spaced away from the substrate surface 118 than the corners of the plate 110, thereby reducing the amount of gas flow provided along the edge of the substrate 140 relative to the substrate corners, thereby tuning the film profile and film properties formed on the substrate 140. In another embodiment, a convex curved edge of the gas distribution plate 110 may be used to have the corners of the gas distribution plate 110 spaced farther than the edges of the distribution plate 110 from the substrate surface 118, thereby increasing the amount of gas flow provided along to the corners of the substrate 140, relative to the substrate edges, thereby tuning the film profile and film properties formed on the substrate 140.

A remote plasma source 124, such as an inductively coupled remote plasma source, may also be coupled between the gas source and the backing plate. Between processing substrates, a cleaning gas may be energized in the remote plasma source 124 to remotely provide plasma utilized to clean chamber components. The cleaning gas may be further excited by the RF power provided to the gas distribution plate 110 by the power source 122. Suitable cleaning gases include, but are not limited to, $NF_3$, $F_2$, and $SF_6$. Examples of remote plasma sources are disclosed in U.S. Pat. No. 5,788,778 issued Aug. 4, 1998 to Shang et al, which is incorporated by reference.

In one embodiment, the substrate 140 that may be processed in the chamber 100 may have a surface area of 10,000 $cm^2$ or more, such as 40,000 $cm^2$ or more, for example about 55,000 $cm^2$ or more. It is understood that after processing the substrate may be cut to form smaller solar cells or other devices.

In one embodiment, the heating and/or cooling elements 139 may be set to provide a substrate support assembly temperature during deposition of about 400 degrees Celsius or less, for example between about 100 degrees Celsius and about 400 degrees Celsius, or between about 150 degrees Celsius and about 300 degrees Celsius, such as about 200 degrees Celsius.

The nominal spacing during deposition between the top surface of a substrate disposed on the substrate receiving surface 132 and the gas distribution plate 110 may generally vary between 400 mil and about 1,200 mil, such as between 400 mil and about 800 mil, or other distance across the gas distribution plate 110 to provide desired deposition results. In one exemplary embodiment for a concave downstream surface gas distribution plate 110 is utilized, the spacing between the center portion of the edge of the plate 110 and the substrate receiving surface 132 is between about 400 mils and about 1400 mils and the spacing between the corners of the plate 110 and the substrate receiving surface 132 is between about 300 mils and about 1200 mils.

For deposition of silicon films, a silicon-based gas and a hydrogen-based gas are provided. Suitable silicon based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. Suitable hydrogen-based gases include, but are not limited to hydrogen gas ($H_2$). The p-type dopants of the p-type silicon layers may each comprise a group III element, such as boron or aluminum. In one embodiment, boron is used as the p-type dopant. Examples of boron-containing sources include trimethylboron (TMB), diborane ($B_2H_6$), $BF_3$, $B(C_2H_5)_3$, $BH_3$, $BF_3$, and $B(CH_3)_3$ and similar compounds. In one embodiment, TMB is used as the p-type dopant. The n-type dopants of the n-type silicon layer may each comprise a group V element, such as phosphorus, arsenic, or antimony. Examples of phosphorus-containing sources include phosphine and similar compounds. The dopants are typically provided with a carrier gas, such as hydrogen, argon, helium, and other suitable compounds. In the process regimes disclosed herein, a total flow rate of hydrogen gas is provided. Therefore, if a hydrogen gas is provided as the carrier gas, such as for the dopant, the carrier gas flow rate should be subtracted from the total flow rate of hydrogen to determine how much additional hydrogen gas should be provided to the chamber.

Figure 2:
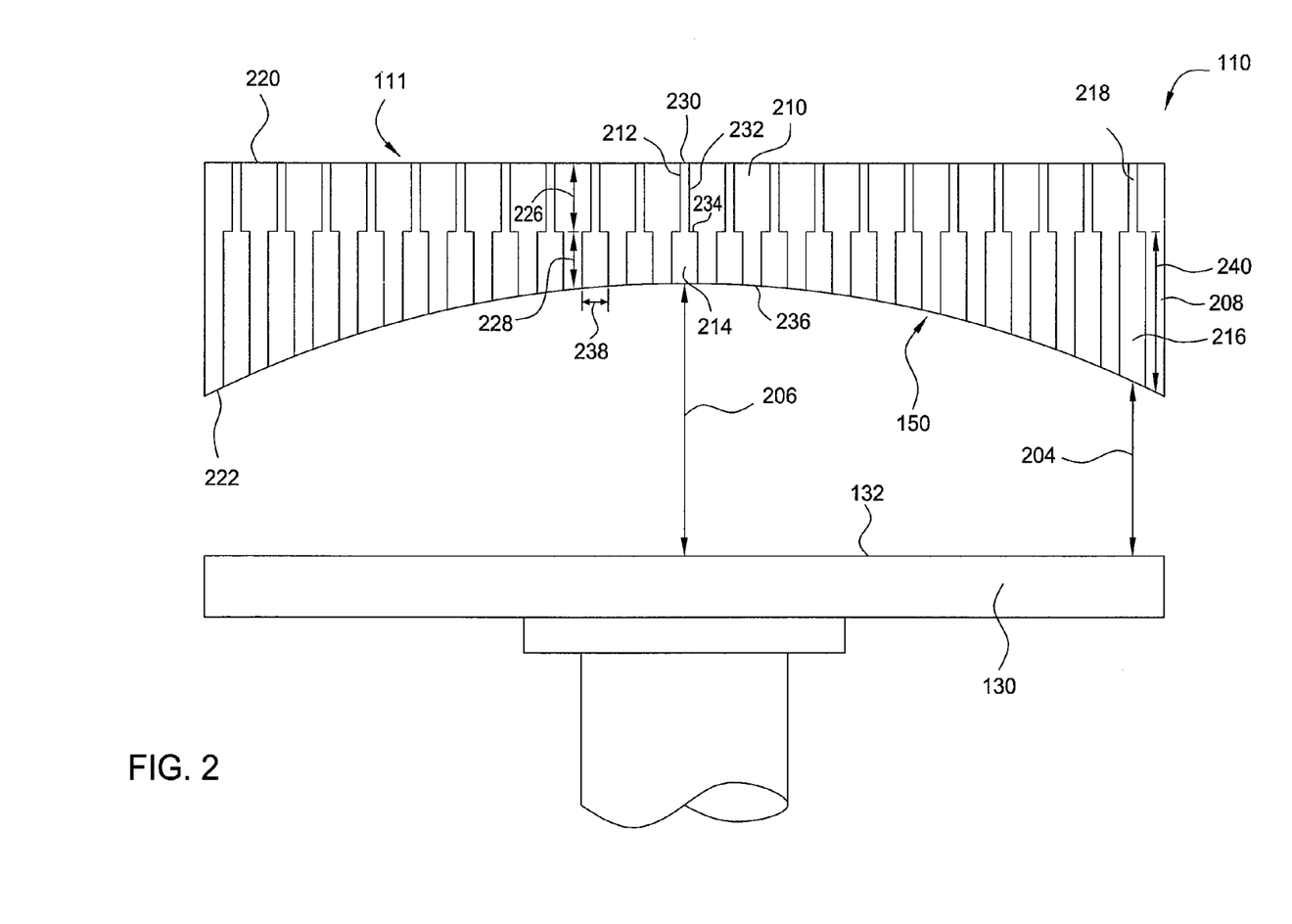
FIG. 2 is a sectional view of an exemplary embodiment of a gas distribution plate having a curvature surface in accordance with the present invention.

FIG. 2 is a sectional view of an exemplary embodiment of a gas distribution plate 110 having a curvature surface in accordance with one embodiment of the present invention. The gas distribution plate 110 has an upper side 220 facing the backing plate 112 and an opposing downstream side 150 facing the substrate support assembly 130. In one embodiment, the downstream side 150 of the gas distribution plate 110 may have a concave surface relative to a surface 132 of the substrate support assembly 130. The curved downstream side 150 of the gas distribution plate 110 has a center portion 210 extending inwardly away from the substrate support surface 132 than an edge portion 208 of the gas distribution plate 110. The downstream side 150 of the gas distribution plate 110 has a perimeter that includes edges 208 and four corners of the plate 110. As the downstream side 150 of the gas distribution plate 110 is curved, the corner of the gas distribution plate 110 is closer to the upper surface 132 of the substrate support assembly 130.

Figure 9A:
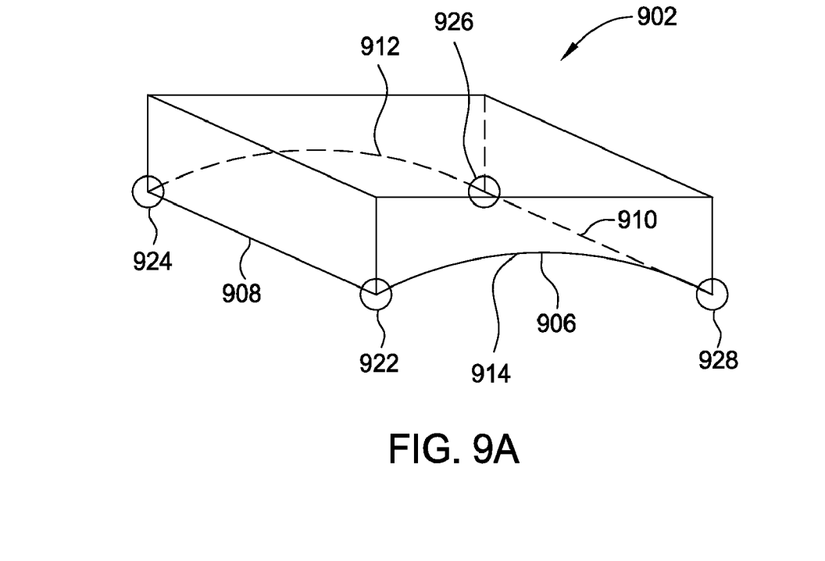
FIGS. 9A-9B depict plain views of different embodiments of curved gas distribution plates.
Figure 9B:
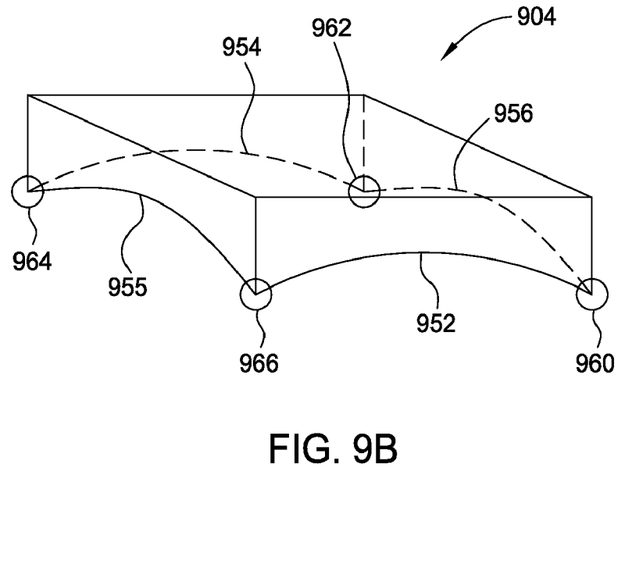

Referring additionally to one embodiment of a gas distribution plate 902 depicted in FIG. 9A, the gas distribution plate 902 has a perimeter that includes corners 922, 924, 926, 928 and edges 906, 908, 910, 912. It is noted that the apertures formed through the plate 902 are not depicted for sake of clarity. A center 914 of the edge 906 of the plate 902 is spaced further away from the substrate support assembly 130 than the edges 908, 910 and corners 922, 924, 926, 928 of the plate 902. The apertures through the corners 922, 924, 926, 928 have longer lengths as compared to apertures formed through the center 914 of the edge 906, and thus have a great flow conductance so that more process gas is delivered through the plate 902 through to the center 914 of the edge 906 relative to the flows through the corners 912, 914, 926, 928. It has been discovered than when depositing polysilicon utilizing a plasma enhanced CVD process, increased crystal volume and/or fraction uniformity is obtained utilizing gas distribution plates having edge to center spacing gradients as compared to gas distribution plates having uniform spacing around the perimeter of the plate. Although the embodiment depicted in FIG. 9A illustrates an edge to center spacing gradient defined on only two edges of the plate 902, FIG. 9B illustrates another embodiment of a gas distribution plate 904 which has spacing gradients defined along each of the four edges 955, 952, 954, 956 compared to the corners 960, 962, 964, 966. Additionally, although the gas distribution plates 902, 904 are shown with the spacing gradients facing the substrate with a flat side of the distribution plates 902, 904 facing upward, it is contemplated that the flat side of the gas distribution plates 902, 904 may be oriented toward the substrate or that both sides of the gas distribution plates 902, 904 may include edge to corner spacing gradients.

Referring back to FIG. 2, the distance 206 from downstream surface of the center portion 210 to the substrate support surface 132 is greater than the distance 204 from the edge portion 208 to the substrate support surface 132, forming a concave surface. The distance 206 from the downstream surface of the center portion 210 to the substrate support surface 132 is controlled at between about 400 mils and about 1400 mils and the distance 204 from the downstream surface of the edge portion 208 to the substrate support surface 132 is controlled at between about 300 mils and about 1200 mils. In another embodiment, the length difference between distance 206 from the downstream surface in the center portion 210 and the distance 204 in the edge portion 208 is controlled between about 50 mils and about 500 mils.

A plurality of apertures 111 are formed in the plate 110 having openings formed on the upper side 220 and the downstream side 150 of the gas distribution plate 110. The apertures 111 may have different configurations, shape, features, and numbers to meet different process requirements. In the embodiment depicted in FIG. 2, the apertures 111 includes a first bore 212 coupled to a second bore 214, collectively forming a fluid path that allows the gas from the gas source 120 to pass therethrough to the substrate support assembly 130. The first bore 212 has an upper opening 230 formed in the upper side 220 of the gas distribution plate 110. The first bore 212 extends a first depth 226 extending from the upper opening 230 to a lower opening 232. The lower opening 232 couples to an upper opening 234 of the second bore 214. The second bore 214 has a second depth 228 extending from the upper opening 234 to a lower opening 236 formed on the downstream surface 150 of the gas distribution plate 110. Although the embodiment depicted in FIG. 2 providing apertures 111 including the first bore 212 and the second bore 214, it is contemplated that the apertures 111 may be in form of a single straight hole, or any other different configurations as needed.

In one embodiment, the second bore 214 has a diameter 238 selected in a range that would not create hollow cathode effect. For example, during deposition, a plasma is generated to ionize the gas mixture supplied in the chamber, and the plasma may enter the second bore 214 when the bore has certain diameters. With a selected range of diameters formed in the second bore 214, the plasma may be dwelled in the second bore 214 in the gas distribution plate 110, thereby increasing electron emission, oscillation movement of electrons, and gas ionization, resulting in so-called "hollow cathode effect" to assist plasma remaining during processing. In contrast, in embodiments where the second bore 214 are selected with small diameters less than a range or large diameters more than a range, the plasma may not be able to remain in the second bore 214, thereby preventing the plasma from remaining in the second bore 214 and eliminating undesired over reaction and/or over depositing. In one embodiment, the diameter 238 of the second bore 214 has a diameter between about 0.01 inch and about 0.8 inch.

In some embodiments where hollow cathode effect is desired, the diameter 238 of the second bore 214 may be selected to have a diameter between about 0.05 inches and about 0.5 inches sufficient to allow the hollow cathode effect to be created therein.

As the downstream surface 150 may be curved to have a concave surface, the second bore 214 formed in the center portion 210 of the gas distribution plate 110 may have the depth 228 shorter than the depth 240 formed in the edge portion 208 of the gas distribution plate 110. In embodiments where the downstream surface 150 of the gas distribution plate 110 may have different configurations, such as convex surface, the length, depth, diameters of both the first and second bore may be varied. In some other embodiments where both hollow cathode gradient (HCG) (e.g., bores with different length or diameter to create gradient across the plate 110) and spacing gradient are desired, the curved downstream surface 150 not only provides the spacing gradient between the plate 110 and the substrate support assembly 130, but also machines the second bore 214 to form different length, thereby concurrently creating desired hollow cathode gradient and spacing gradient to the substrate surface.

As the distance between the downstream surface 150 and the substrate support assembly 130 is gradually changed across the substrate support surface 132, the film configured to be deposited on the substrate surface may be varied as well. Depositing different films may apply different RF power, gas flow, precursor species, and process pressure in the chamber to enable the process. As the plasma may have different distributions across the chamber, the film deposited on the substrate surface may have different profiles. Additionally, standing wave effect generated from RF power may influence the plasma and ion distribution and gas flow in the chamber, thereby resulting in plasma non-uniformity across the substrate surface. The gradient spacing created between the curved downstream surface 150 of the gas distribution plate 110 and the substrate support surface 132 provides a manner that may compensate the non-uniform plasma and/or gas, ion distribution in the chamber, thereby providing a method to adjust the film profile and film property uniformity to meet different process conditions.

Figure 3A:
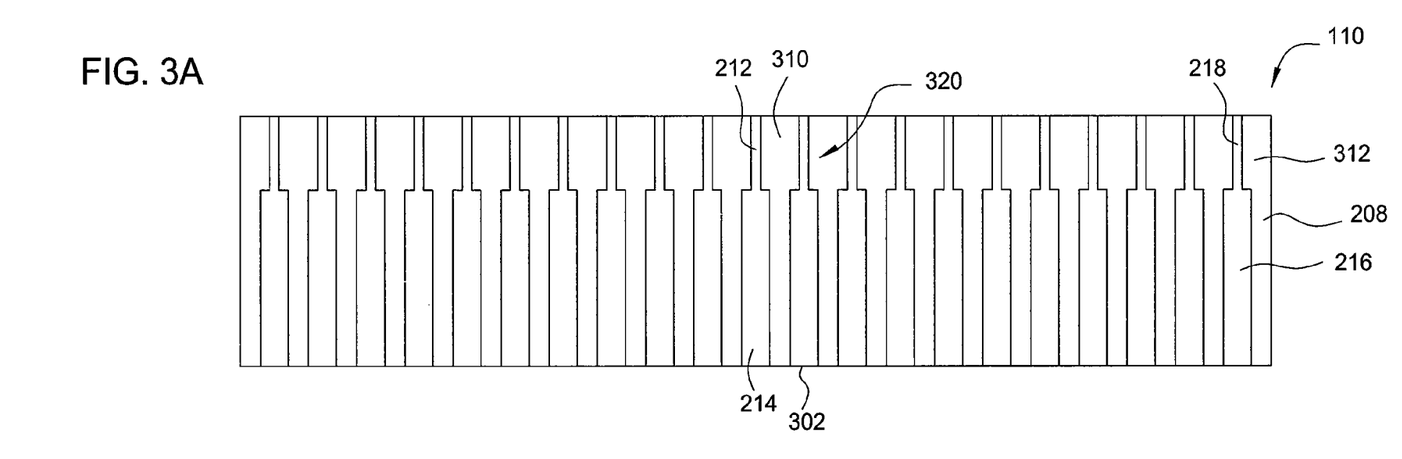
FIG. 3A-B depicts cross sectional view of a gas distribution plate 110 at different stages of a process flow for manufacturing the gas distribution plate 110 with a curved surface.
Figure 3B:
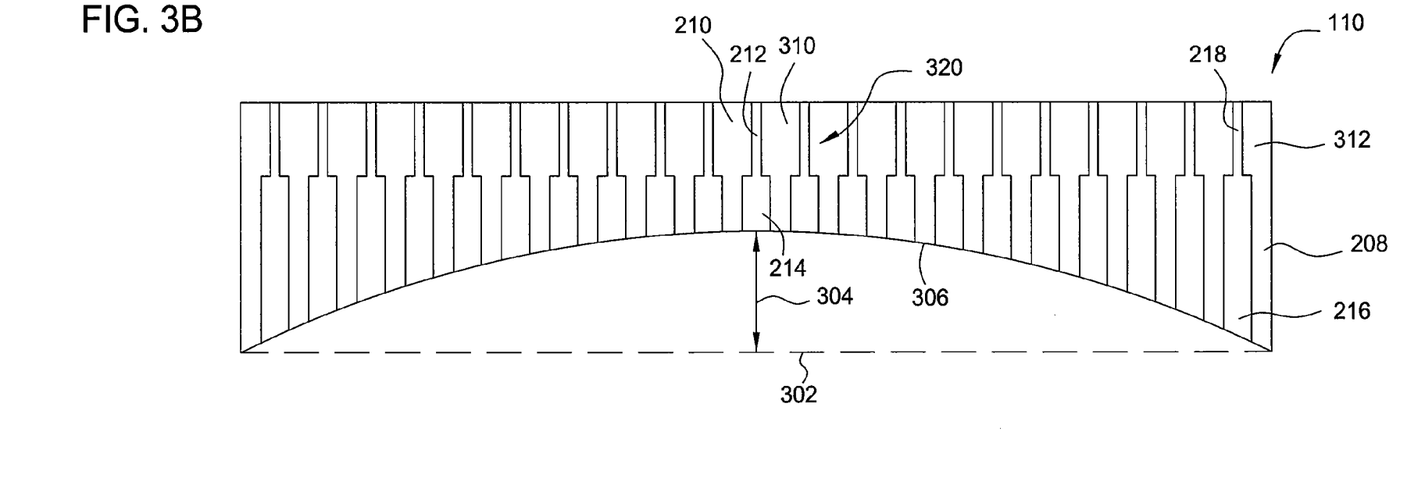

FIGS. 3A-B depict cross sectional views of a gas distribution plate 110 at different stages of manufacture. A plurality of apertures 111 may be pre-drilled into the plate 110, as shown in FIG. 3A. The apertures 111 have the first bores 212, 218 and the second bores 214, 216 formed in the completed plate 110 as described in FIG. 2 above. The first bore 212 and the second bore 214 formed in a center portion 310 of the plate 110 are identical as the first bore 218 and the second pore 216 formed in an edge portion 312. The plate 110 has a flat downstream surface 302 that is machined or otherwise formed into a concave surface 306. The machining process removes a portion of the plate 110 out from the downstream surface 302 of the plate 110, creating a concave surface 306 of the plate 110 having the center portion 310 of the plate 110 thinner than the edge portion 312, as shown in FIG. 3B. The curved surface 306 of the plate 110 creates a gradually changing distance between the curved surface 306 to the substrate support assembly 130 upon installation of the plate 110 in the chamber 100. A chord depth 304 is created between the curved surface 306 and the original flat surface (as shown in phantom 302) between about 0.05 inches and about 1 inches, thereby creating a gradual changing distance between the curved surface 306 to the facing substrate support assembly 130. The chord depth 304 formed between the curved surface 306 and the original flat surface (as shown in phantom 302) is small relative to the size of the plate 110. In one embodiment, the maximum chord depth 304 may be controlled at a length no more than about 3 percent of the characteristic length of the plate 110, such as between about 0.1 percent and about 2.0 percent. For purpose of comparing the chord depth 304 to a rectangular or circular plate, the characteristic length is considered to be the "equivalent radius". For a circular diffuser, the equivalent radius is equal to the radius of the plate. For a square or rectangular plate, the equivalent radius is one half of the diagonal. In the embodiment of the plate 110 having a dimension of about 2200 mm×1870 mm, the equivalent radius is about 1440 mm and the maximum chord depth 304 is about 28.4 mm.

In one embodiment, the configurations of the second bore 214 may be changed after machining process. As a greater amount of the center portion 310 of the plate 110 may be machined to create the curved surface 306. A portion of the second bores 214 may be machined, thereby reducing the depth and/or length of the second bore 214. Therefore, the machined second bore 214 in the center portion 310 has a length and/or depth shorter than that of the second bore 216 in the edge portion 208.

In another embodiment, the apertures 320 may be drilled after the curved surface 306 of the plate 110 has been machined. It is noted that the sequence of the aperture drilling process and the machining process may be varied according to different manufacturing requirements.

In another embodiment, a thermal anneal process may be performed on the plate 110 to form the curved surface on the downstream surface thereof. The thermal anneal process may be performed by providing the plate 110 into an enclosure, such as a furnace, to thermally treat the plate 110. As the plate 110 is heated and softened, the plate 110 may be pulled by gravity and sagged to form a desired curved surface on the downstream surface of the plate 110. Examples of different manufacture methods are disclosed in U.S. Publication No. 2006/0228496 published on Oct. 12, 2006 to Choi, et al. The thermal anneal process for forming the curved surface may be used in embodiments where a smaller curvature is desired to form on the plate 110, as opposed to the surface curvature formed by the machining process described in FIG. 3A-B.

Figure 4:
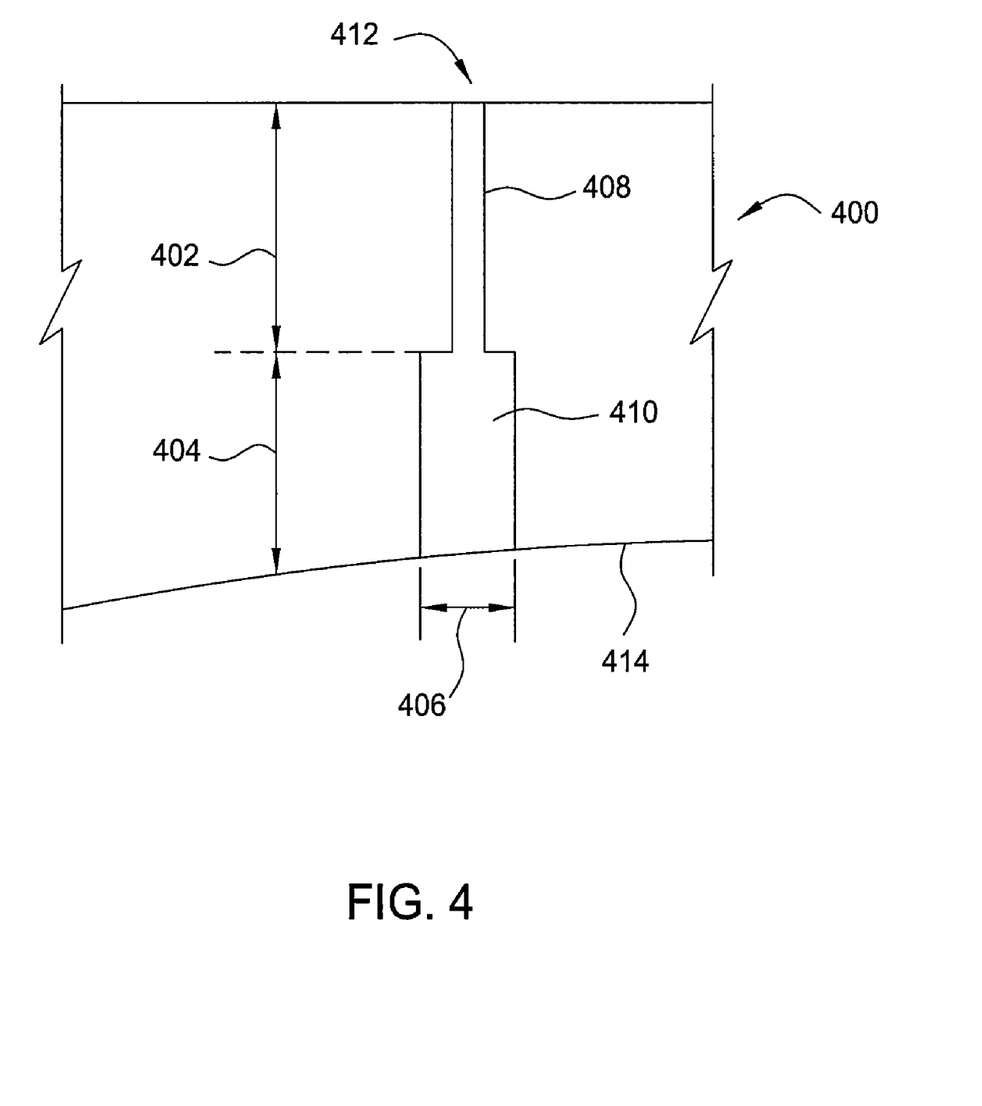
FIG. 4 depicts an embodiment of an aperture formed in a gas distribution plate.
Figure 5A:
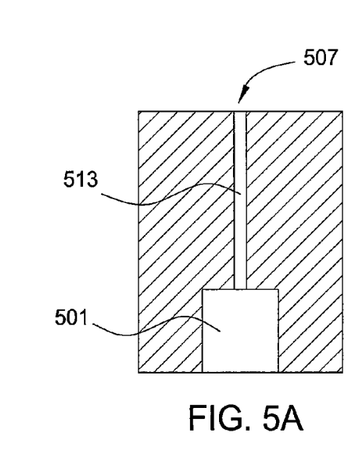
FIGS. 5A-F depicts an aperture having different configurations of a second bore in a plate.
Figure 5B:
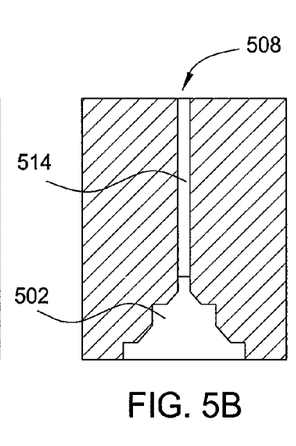
Figure 5C:
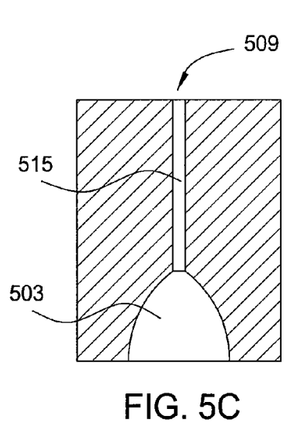
Figure 5D:
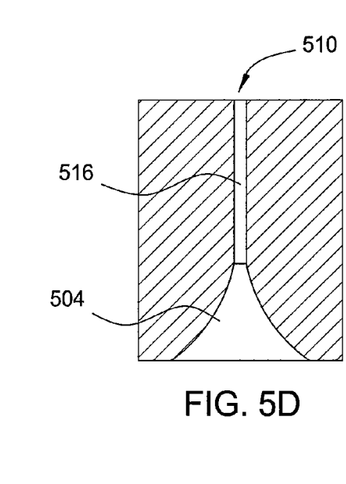
Figure 5E:
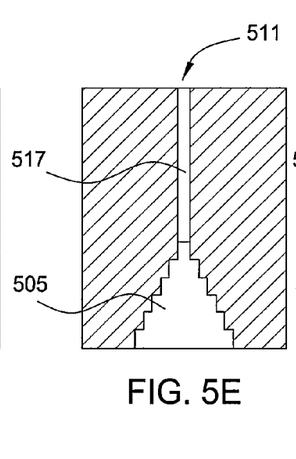
Figure 5F:
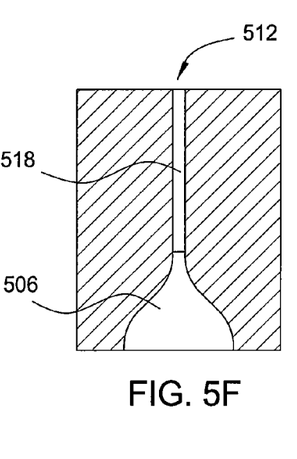

FIG. 4 depicts an embodiment of an aperture 412 formed in a gas distribution plate 400. The aperture 412 may be formed in the plate 400 by different manners having different depths, diameters, shape, and the like. In one embodiment, the aperture 412 may be formed in the plate 400 by a computer numerically controlled (CNC) machining. The distribution of the apertures 412 with certain desired configurations may be predrilled into the plate 400. In one embodiment, a portion of the apertures is pre-drilled into a portion of the plate. Subsequently, other apertures may be drilled in the remaining portion of the plate 400 until a desired distribution across the plate 400 is completed. In one embodiment, the apertures 412 have a first bore 408 having a first depth 402 connecting a second bore 410 having a second depth 404. The second bore 410 is formed in a downstream surface 414 of the plate 400 configured to face the substrate support assembly 130 during processing. In one embodiment, the first bore 408 has a depth between about 0.2 inch and about 2 inch and the second bore 410 has a depth between about 0.1 inch and about 1 inch. The second bore 410 has a diameter 406 selected within a desired range that would not cause hollow cathode effect. In one embodiment, the diameter 406 of the second bore 410 may be selected at a range less than about 0.05 inch that the plasma may not be able to dwell in the second bore 410 to create hollow cathode effect. In another embodiment, the diameter 408 of the second bore 410 may be selected at a range greater than about 0.5 inches to prevent the electron oscillation in the second bore 410, thereby preventing hollow cathode effect created in the second bore 410. In some embodiment where a hollow cathode effect may be desired, the diameters 408 of the second bore 410 may be controlled at between about 0.05 inches and about 0.5 inches.

FIGS. 5A-F depict apertures 507-512 having different configurations for second bores 501-506 formed in a plate. The second bores 501-506 may have different configurations, such as square shape 501, step-wall shape 502, cone shape 503, flare-out shape 504, multi-step-wall shape 505, round flare-out shape 506, and the like. The depth of the first bores 513-518 may be varied to meet different process requirements.

Figure 6:
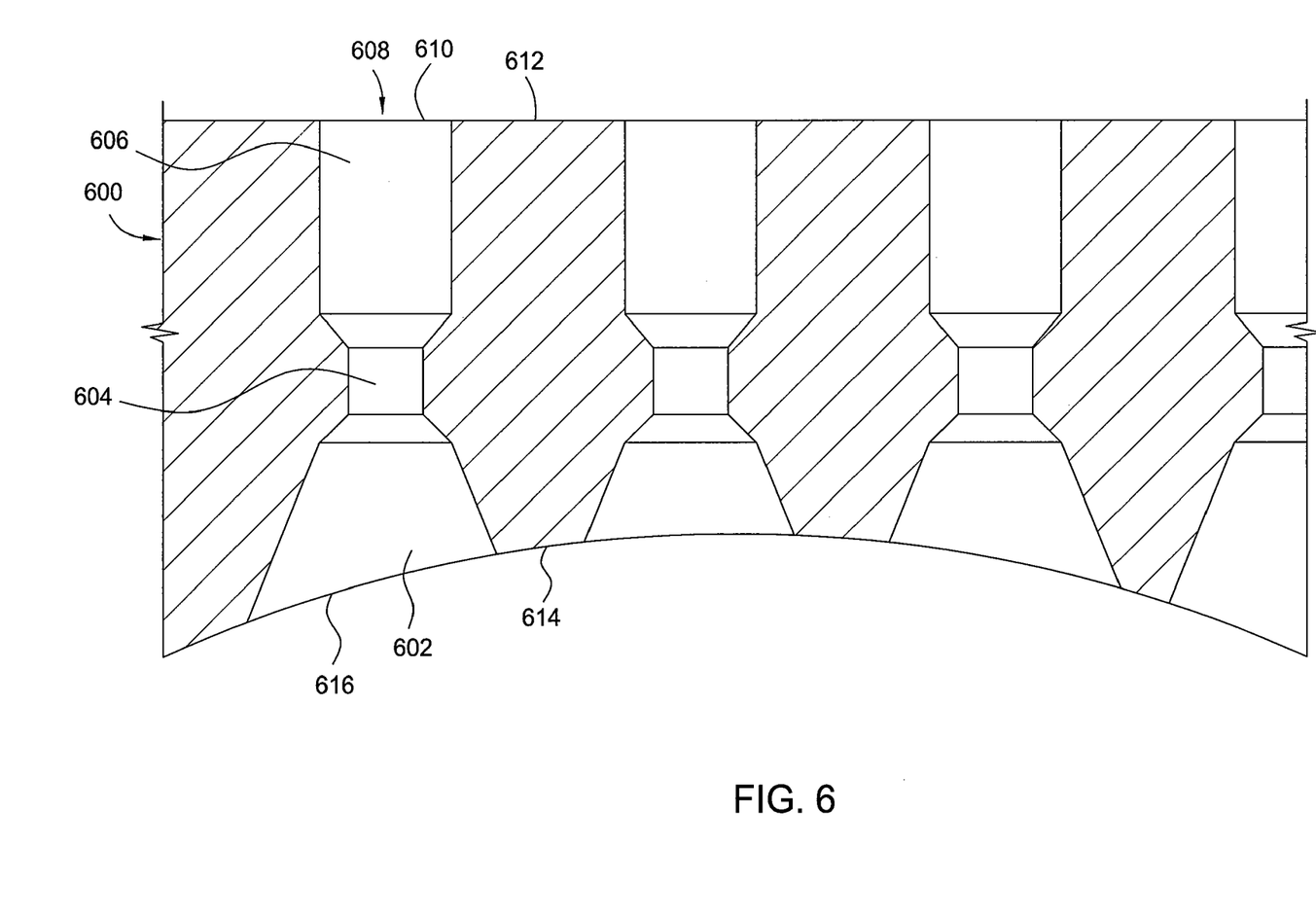
FIGS. 6 depicts another embodiment of a curved gas distribution plate 600 having apertures with different configuration formed in the plate 600.

FIG. 6 depicts another embodiment of a curved gas distribution plate 600 having apertures 608 with different configurations formed in the plate 600. The aperture 608 has a first bore 606 and a second bore 602 connected by an orifice 604 formed therebetween. The first bore 606 is formed on the upper portion of the plate 600 having a first opening 610 formed on an upper side 612 of the plate 600. The second bore 602 is formed on the curved downstream side 614 of the plate 600 having an opening 616 opened toward the substrate support assembly 130. The opening 616 of the second bore 602 may be flared out at a desired angle, thereby assisting uniform distribution of the process gases across the substrate surface. The configuration of the second bore 602 may be controlled in a manner that would not create hollow cathode effect therein. Alternatively, the configuration of the second bore 602 may be controlled in any manner to enable or prevent hollow cathode effect.

Figure 7:
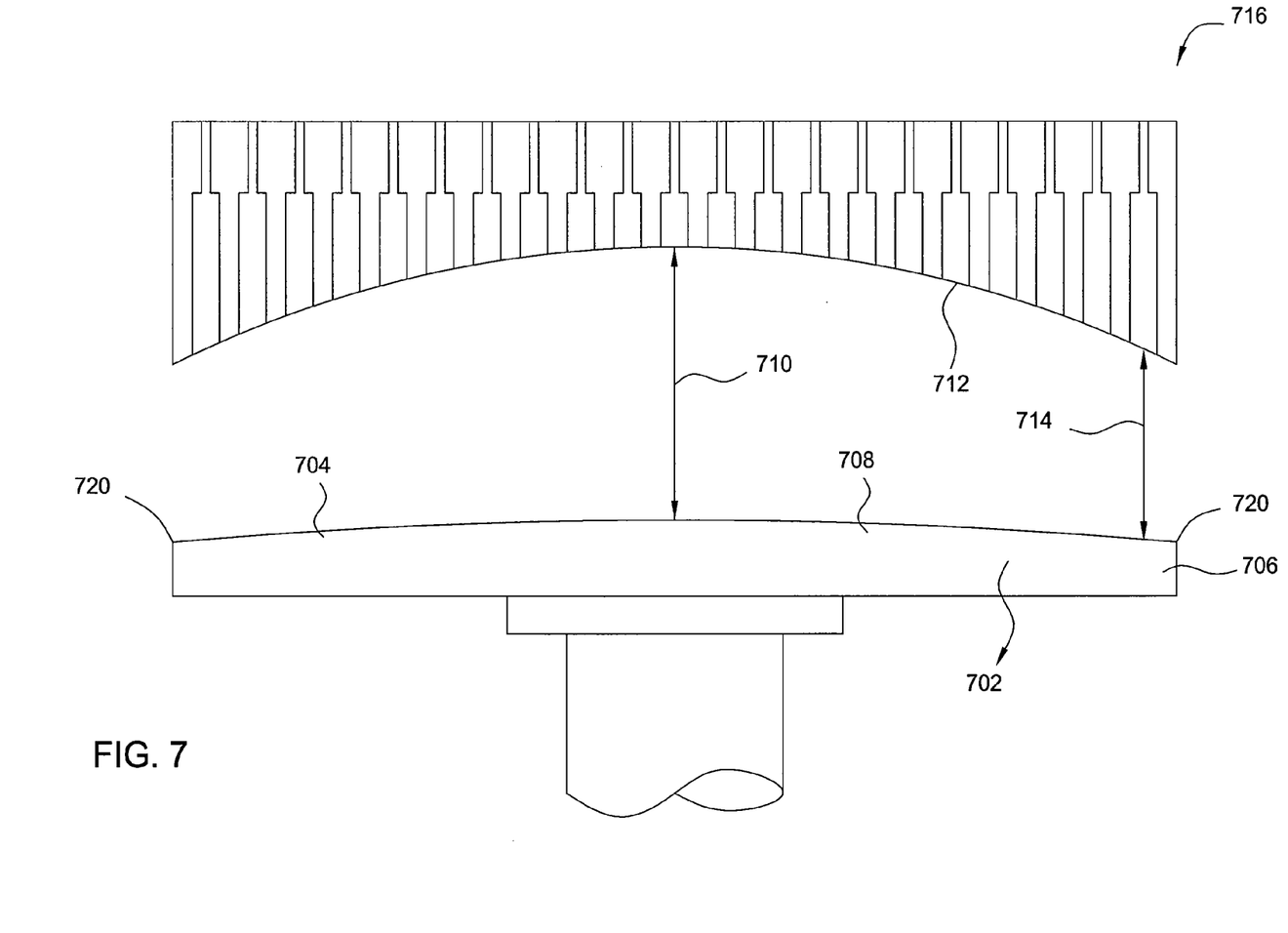
FIG. 7 depicts another embodiment where a gradient spacing may be created by a curved substrate support assembly disposed in the chamber.

FIG. 7 depicts another embodiment where a gradient spacing may be created by a curved substrate support assembly 702 disposed in the chamber 100. The substrate support assembly 702 may have a curved surface 704, such as a convex surface, having a center portion 708 thicker than an edge portion 706 of the support assembly 702, and corners 720 that are thinner than the edge portions 706. Alternatively, the substrate support assembly 702 may have a convex or concave substrate support surface. For example, the center portion 708 may be bowed to an elevation above the edge portion 706. The convex shape of the substrate support also assists in preventing air from becoming entrapped between the substrate and substrate surface. As the substrate support assembly 702 may be curved, the distance between the substrate support assembly 702 and a gas distribution plate 716 disposed in the chamber may be selected to obtain a desired processing result. In one embodiment, the distance 710 between the center portion 708 of the substrate support assembly 702 to the gas distribution plate 716 may be greater than the distance 714 from the edge portion 706 of the substrate support assembly 702 to the plate 716 or vise versa. In one embodiment, the thickness difference between the center 708 and the edge portion 706 of the substrate support assembly 702 (i.e., either center 708 thicker or thinner than the edge 706) may be between about 0.05 inch and about 0.5 inch. In the embodiment depicted in FIG. 7, the gas distribution plate 716 has a curved downstream 712 surface that faces the convex surface of the substrate support assembly 706. Alternatively, the gas distribution plate 716 may have any different types of configurations selected to meet different process requirements. For example, a gas distribution plate having a first downstream face used with a convex or concave substrate support surface. The surface curvature of the substrate support assembly 702 and the gas distribution plate 716 may have different combinations as needed.

Figure 8:
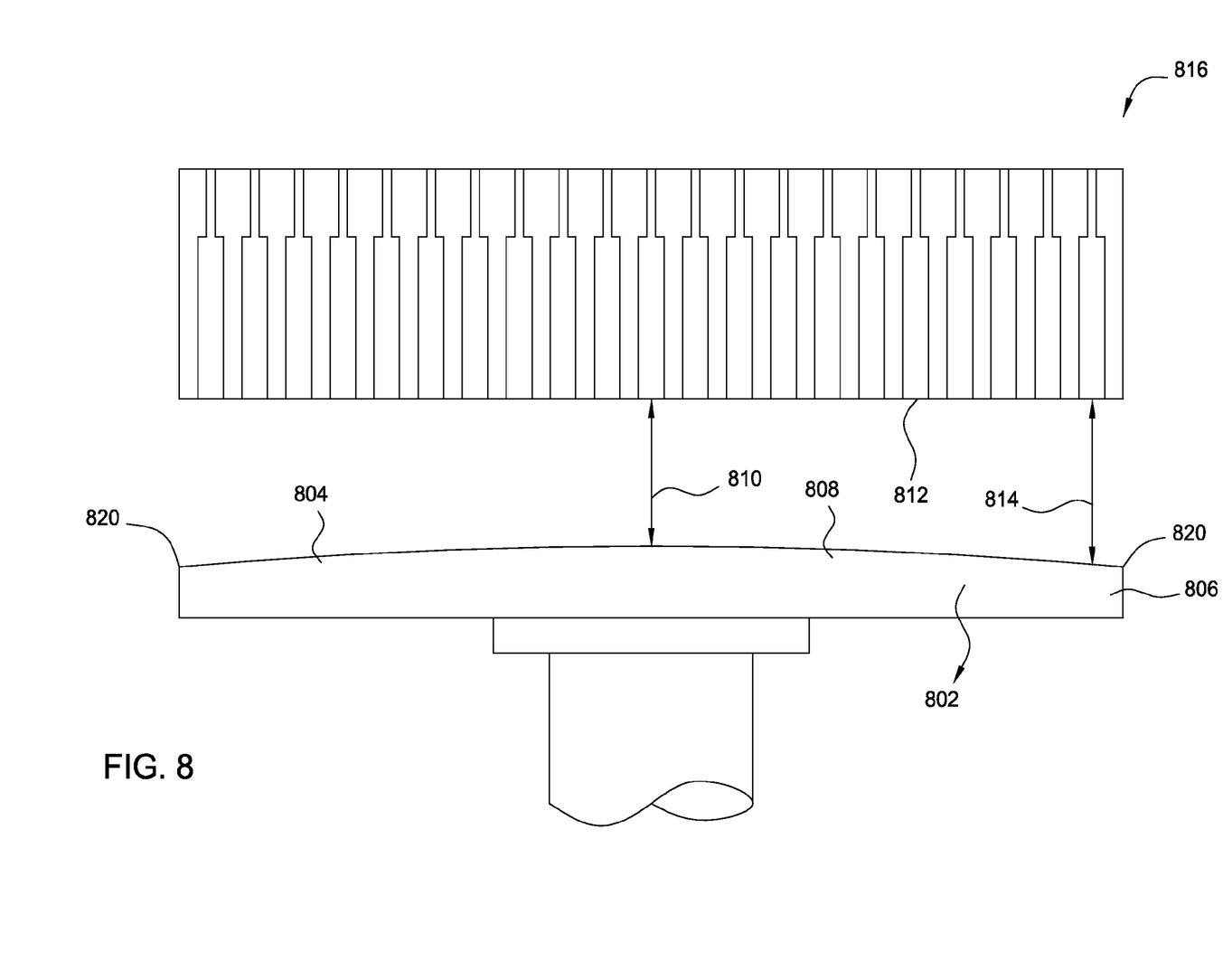
FIG. 8 depicts another embodiment where a gradient spacing may be created by a curved substrate support assembly disposed in the chamber.

In an exemplary embodiment depicted in FIG. 8, a gradient spacing may be created by a curved substrate support assembly 802 disposed in the chamber 100 having a gas distribution plate 816 having a substantially planar downstream surface 812. As the substrate support assembly 802 is curved to have a convex surface 804 having a center portion 808 thicker than an edge portion 806 and corners 820 of the support assembly 802, the distance 810 between the center portion 808 of the substrate support assembly 802 and the gas distribution plate 816 may be less than the distance 814 from the edge portion 806 of the substrate support assembly 802 to the plate 816, while the distance between the edge portion 806 and gas distribution plate 816 is less than a distance between the corners 820 and the plate 816. Alternatively, the gas distribution plate 816 and the substrate support assembly 802 may be in form of any configurations and may be in any combination thereof for any specific processes as needed.

In an exemplary embodiment for deposition a silicon film for solar cell application utilizing a curved gas distribution assembly and/or a curved substrate support assembly, the deposition process may be configured to deposit an amorphous or a microcrystalline layer. The microcrystalline layer may be an i-type layer formed in a p-i-n junction for solar cell devices. The p-i-n junction may be formed on a glass substrate having a first Transparent Conductive Oxide (TCO) layer disposed thereon. Furthermore, a second Transparent Conductive Oxide TCO layer may be disposed on the top of the p-i-n junction to form the desired solar cell devices. Alternatively, the microcrystalline layer may be utilized to form other devices. In the embodiment of depositing the intrinsic type microcrystalline silicon layer, a gas mixture of silane gas to hydrogen gas in a ratio between 1:20 and 1:200 may be supplied into the chamber 100. The gradient spacing defined between the gas distribution plate and the substrate support assembly is selected having a chord depth between about 0.05 inch and about 0.5 inch. Alternatively, the gradient spacing may be selected having a distance between the gas distribution plate and the substrate support assembly of about 300 mils and about 1400 mils. Silane gas may be provided at a flow rate between about 0.5 sccm/L and about 5 sccm/L. Hydrogen gas may be provided at a flow rate between about 40 sccm/L and about 400 sccm/L. In some embodiments, the silane flow rate may be ramped up from a first flow rate to a second flow rate during deposition. In some embodiments, the hydrogen flow rate may be ramped down from a first flow rate to a second flow rate during deposition. An RF power between about 300 milliWatts/cm$^2$ or greater, preferably 600 milliWatts/cm$^2$ or greater, may be provided to the gas distribution plate. In some embodiments, the power density may be ramped down from a first power density to a second power density during deposition. The pressure of the chamber is maintained between about 1 Torr and about 100 Torr, such as between about 3 Torr and about 20 Torr, for example, between about 4 Torr and about 12 Torr. Alternatively, the pressure during deposition may be segmented into one ore more steps, such as ramping up from a first pressure and to a second pressure after processing for a predetermined period. The deposition rate of the intrinsic type microcrystalline silicon layer may be about 200 Å/min or more, preferably 500 Å/min. Methods and apparatus for deposited microcrystalline intrinsic layer are disclosed in U.S. patent application Ser. No. 11/426,127 filed Jun. 23, 2006, entitled "Methods and Apparatus for Depositing a Microcrystalline Silicon Film for Photovoltaic Device," which is incorporated by reference in its entirety to the extent not inconsistent with the present disclosure. The microcrystalline silicon intrinsic layer has a crystalline fraction between about 20 percent and about 80 percent, such as between 55 percent and about 75 percent.

Thus, an apparatus having a gradient spacing created between a substrate support assembly and a gas distribution plate for depositing a silicon film suitable for solar cell applications is provided. The improved apparatus advantageously provide a better control of the film profile and properties deposited on a substrate, thereby increasing the film quality, photoelectric conversion efficiency and device performance. Particularly, crystalline volume and crystal fraction ratio at the corners of the substrate have been improved over conventional practices.

While the foregoing is directed to embodiments of the present invention, other and further embodiments of the invention may be devised without departing from the basic scope thereof, and the scope thereof is determined by the claims that follow.

What is claimed is:

1. An apparatus for depositing films suitable for solar cell applications, comprising:
   a processing chamber;
   a substrate support disposed in the processing chamber and configured to support a quadrilateral substrate thereon; and
   a gas distribution plate disposed in the processing chamber above the substrate support, wherein a bottom surface of the gas distribution plate has a perimeter that includes edges and corners, and wherein the corners of the gas distribution plate are closer to the substrate support than each of the edges of the gas distribution plate, wherein the corners of the gas distribution plate are configured to deposit a silicon film having an increased crystal volume at corners of deposited silicon film.

2. The apparatus of claim 1, wherein the bottom surface of the gas distribution plate further comprises a center portion that is spaced further from the substrate support than the edges of the gas distribution plate.

3. The apparatus of claim 1, wherein the substrate support further comprises:
   a curved upper surface.

4. The apparatus of claim 1, further comprising:
   a plurality of apertures formed through the gas distribution plate.

5. The apparatus of claim 4, wherein the apertures have a diameter between about 0.01 inch and about 1 inch.

6. The apparatus of claim 5, wherein the gas distribution plate has a center thickness less than a thickness at the edge of the gas distribution plate.

7. The apparatus of claim 1, wherein the gas distribution plate has a curved downstream surface.

8. The apparatus of claim 7, wherein the curved surface is on the gas distribution plate and has a chord depth between about 0.05 inch and about 1 inch.

9. The apparatus of claim 7, wherein the curved surface is formed on the gas distribution plate and has at a chord depth of no more than about 3 percent of a length of the plate.

10. An apparatus for depositing films suitable for solar cell applications, comprising:
    a processing chamber;
    a substrate support disposed in the processing chamber and configured to support a quadrilateral substrate thereon; and
    a gas distribution plate disposed in the processing chamber above the substrate support, wherein a bottom surface of the gas distribution plate has a perimeter that includes edges and corners, and wherein each of the edges of the gas distribution plate are concave wherein the corners of the gas distribution plate are configured to deposit a silicon film having an increased crystal volume at corners of deposited silicon film.

11. The apparatus of claim 10, wherein the corners of the gas distribution plate have a thickness greater than a thickness of the gas distribution plate at a midpoint of the edge, and wherein a center of the gas distribution plate has a thickness less than the thickness at the midpoint of the edge.

12. The apparatus of claim 10, wherein the gas distribution plate further comprises:
    a plurality of apertures formed therethrough, wherein the apertures located along the edge of the gas distribution plate have a flow conductance that is greater than a conductance of the apertures located at the corners and less than a conductance of the apertures located in a center of the gas distribution plate.

* * * * *